(12) United States Patent
Yamada

(10) Patent No.: US 9,905,496 B2
(45) Date of Patent: Feb. 27, 2018

(54) WIRING CIRCUIT BOARD AND METHOD OF MANUFACTURING THE SAME

(71) Applicant: NHK SPRING CO., LTD., Yokohama-shi, Kanagawa (JP)

(72) Inventor: Yukie Yamada, Kanagawa (JP)

(73) Assignee: NHK Spring Co., Ltd., Kanagawa (JP)

(*) Notice: Subject to any disclaimer, the term of this patent is extended or adjusted under 35 U.S.C. 154(b) by 0 days.

(21) Appl. No.: 15/367,494

(22) Filed: Dec. 2, 2016

(65) Prior Publication Data

US 2017/0179005 A1 Jun. 22, 2017

(30) Foreign Application Priority Data

Dec. 21, 2015 (JP) ................... 2015-248931

(51) Int. Cl.
*H01L 23/495* (2006.01)
*H01L 21/48* (2006.01)

(52) U.S. Cl.
CPC .... *H01L 23/49534* (2013.01); *H01L 21/4803* (2013.01); *H01L 21/4825* (2013.01); *H01L 21/4828* (2013.01); *H01L 23/49524* (2013.01); *H01L 23/49544* (2013.01); *H01L 23/49558* (2013.01)

(58) Field of Classification Search
CPC .. H05K 3/3442; H05K 3/3452; H05K 3/3478; H05K 3/3498; H01L 23/49534; H01L 23/49558; H01L 23/49544; H01L 23/49524; H01L 21/4803; H01L 21/4825; H01L 21/4828
See application file for complete search history.

(56) References Cited

U.S. PATENT DOCUMENTS

| | | | |
|---|---|---|---|
| 7,239,484 B2 | 7/2007 | Yamaguchi | |
| 7,984,545 B2 | 7/2011 | Matsumoto et al. | |
| 8,213,121 B2 | 7/2012 | Dela Pena et al. | |
| 8,295,011 B2 | 10/2012 | Chou et al. | |
| 8,295,012 B1* | 10/2012 | Tian ........ | G11B 5/483 360/245.4 |
| 2005/0195529 A1* | 9/2005 | Tsuchida ........ | G11B 5/484 360/234.5 |
| 2009/0025205 A1* | 1/2009 | Matsumoto ........ | B23K 20/007 29/603.01 |
| 2009/0183907 A1* | 7/2009 | Ishii ........ | G11B 5/486 174/260 |
| 2010/0188779 A1* | 7/2010 | Ohsawa ........ | G11B 5/4853 360/246.1 |

(Continued)

FOREIGN PATENT DOCUMENTS

JP 2005-251262 A 9/2005

*Primary Examiner* — Benjamin Sandvik
*Assistant Examiner* — Farid Khan
(74) *Attorney, Agent, or Firm* — Norris McLaughlin & Marcus, P.A.

(57) ABSTRACT

A flexure has a metal support layer, an electric insulating layer laid on a surface of the metal support layer, a wiring layer having a general part laid on a surface of the electric insulating layer and a terminal to provide a conductive connection to an external slider, and a raising structure in a thickness direction of the wiring layer provided to the terminal independently of the metal support layer so that the terminal protrudes from a surface of the general part or has a surface being flush with the surface of the general part.

10 Claims, 13 Drawing Sheets

(56) References Cited

U.S. PATENT DOCUMENTS

2011/0194208 A1* 8/2011 Chou ................... G11B 5/105
                                                    360/234.3
2015/0332715 A1* 11/2015 Kawao ................ G11B 5/4833
                                                    360/244.3

* cited by examiner

WIRING CIRCUIT BOARD AND METHOD OF MANUFACTURING THE SAME

BACKGROUND OF THE INVENTION

1. Field of the Invention

The present invention relates to a wiring circuit board used for, for example, a flexure of a head suspension and a method of manufacturing the same.

2. Description of the Related Art

A hard disk drive (HDD) has a hard disk and a head suspension for supporting a magnetic head (functional part). The magnetic head is connected to wiring of the head suspension to read and write data from and to the hard disk.

Recently, it is required for a HDD higher recording density and higher reliability. For this, additional components such as a heater for controlling a flying height and a head disk interface (HDI) sensor may be incorporated into a magnetic head in addition to usual read/write elements. Further, components for energy assisted recording and the like are considered to be incorporated into the magnetic head. With this, many magnetic heads have ten or more terminals including ground terminals.

In current HDDs, a minute slider so-called "Femto slider" having a width of mere 0.7 mm is used for a magnetic head. To connect the magnetic head to wiring of a head suspension, the ten or more terminals arranged within the width of 0.7 mm of the slider have to be joined to the respective terminals of the wiring of the head suspension without short circuit.

Such a connection between terminals of a slider and a head suspension is often carried out by reflow soldering with the use of micro solder balls as disclosed in U.S. Pat. No. 7,239,484B2, U.S. Pat. No. 7,984,545B2, U.S. Pat. No. 8,213,121B2, U.S. Pat. No. 8,295,011B2, and U.S. Pat. No. 8,295,012B1.

FIGS. 17A and 17B are schematic sectional views illustrating connections established between terminals in a head of a flexure by reflow soldering with the use of a micro solder ball in which FIG. 17A is a relative large connection and FIG. 17B is a relative small connection.

As illustrated in FIGS. 17A and 17B, a micro solder ball 109 is put in a trough part defined between a terminal 103 of a slider 101 and a terminal 107 of a flexure 105 and thereafter is reflowed to form a connection or fillet 111 and bond or solder the terminals 103 and 107 together.

If the number of the terminals 107 is relatively small, for example, four for the read/write elements, the terminals 103 and 107 are relatively large and accordingly the solder ball 109 is also relatively large in size so that the fillet 111 is formed to be thick enough for the connection as illustrated in FIG. 17A.

If the number of the terminals 107 is relatively large, for example, ten for adapting a multi-function slider, however, the terminals 103 and 107 are relatively small and accordingly the solder ball 109 is also relatively small in size so that the fillet 111 is formed to be thin not enough for the connection as illustrated in FIG. 17B. This causes proportion of a defective connection between the terminals 103 and 107 to be increased.

Such a defective connection is also caused on terminals of a tail part that are joined to terminals of a main flexible circuit board using solder balls.

Further, a recent head suspension may have piezoelectric elements that are connected to a flexure in order to minutely position a magnetic head. In this case, conductive paste is used for a connection between terminals of the flexure and the piezoelectric elements. If the amount of the conductive paste is decreased, a defective connection is caused similar to the above.

These problems are caused by level of the terminal as the functional part in a thickness direction. Such a problem is also caused in an aerial wiring part of a flexure in which a wiring layer passes over an opening formed through a metal support layer and a reference hole formed through the wiring layer and used for image processing.

In the aerial wiring part, it is difficult to simultaneously accomplish thinning of an electric insulating layer and flattening of the wiring layer and stabilize rigidity of the flexure.

In the reference hole, a peripheral part of the reference hole is dropped toward the electric insulating layer to have a bent shape and an edge unnecessary for the image processing. This causes misrecognition in the image processing.

To cope with such a problem, there is a technique to correct level of a terminal in a thickness direction as disclosed in JP 2005-251262 A.

FIGS. 18A and 18B are sectional views illustrating terminals defining a reduced gap therebetween by bending a flexure including a metal support layer in which FIG. 18A is of a raised terminal and FIG. 18B is of a inclined terminal.

In FIGS. 18A and 18B, the terminal 107 is bent by machining operation together with the metal support layer 113 so as to change the position of the terminal 107 relative to the terminal 103 of the slider 101 and put the terminal 107 closer to the terminal 103. With this, the gap between the terminals 103 and 107 is reduced to form a thick fillet enough for the connection.

The machining operation conducted to the flexure including the metal support layer 113, however, tends to cause variation in bent shape such as bent angle. This results in variation in thickness of a fillet among products to deteriorate quality of solder bonding.

If such machining operation is conducted to the aerial wiring part, the reference hole, its periphery or the like, it results in variation in bent shape and deterioration of quality of the aerial wiring part or the like.

SUMMARY OF THE INVENTION

An object of the present invention is to provide a wiring circuit board and a method of manufacturing the wiring circuit board, capable of coping with a problem caused by level of a functional part such as terminal in a thickness direction independently of a metal support layer to improve product quality.

In order to accomplish the object, a first aspect of the present invention provides a wiring circuit board including a metal support layer forming a substrate, an electric insulating layer laid on a surface of the metal support layer, a wiring layer having a general part laid on a surface of the electric insulating layer and a functional part connected to the general part to provide a given function, and a raising structure in a thickness direction of the wiring layer provided to the functional part independently of the metal support layer so that the functional part protrudes from a surface of the general part or has a surface being flush with the surface of the general part.

A second aspect of the present invention provides a method of manufacturing the wiring circuit board. The method adds a raising layer to the metal support layer for forming the raising structure before the electric insulating layer is laid on the surface of the metal support layer.

According to the first aspect, the wiring circuit board has the raising structure in the thickness direction independently of the metal support layer to adjust the level of the functional part so as to protrude from the surface of the general part or have the surface being flush with the surface of the general part. With this, the first aspect copes with a problem due to the level of the functional part in the thickness direction and eliminates bending of the metal support layer to prevent variation in shape based on such bending.

According to the second aspect, the method easily sets the raising structure in the thickness direction that is provided to the functional part independently of the metal support layer.

BRIEF DESCRIPTION OF THE DRAWINGS

FIGS. 12A to 12C are sectional views illustrating respective connection structures on top faces of tongues in which FIG. 12A is a comparative example, FIG. 12B is a modification having terminals being put closer to a slider according to the first embodiment and FIG. 12C is another modification raising level of a slider according to the first embodiment;

FIGS. 13A to 13C are sectional views illustrating respective connection structures on top faces of tongues in which FIG. 13A is a comparative example, FIG. 13B is still another modification having terminals being put closer to a slider according to the first embodiment and FIG. 13C is still another modification raising level of a slider according to the first embodiment;

FIGS. 17A and 17B are schematic sectional views each illustrating a connection between terminals at a head part of a flexure without a raising structure according to the related arts in which FIG. 17A is a relative large connection and FIG. 17B is a relative small connection; and FIGS. 18A and 18B are sectional views each illustrating terminals according to the related arts defining a reduced gap therebetween by bending a flexure including a metal support layer in which FIG. 18A is of a raised terminal and FIG. 18B is of an inclined terminal.

DETAILED DESCRIPTION OF EMBODIMENTS

Embodiments according to the present invention will be explained. Each embodiment provides a wiring circuit board and a method of manufacturing the wiring circuit board, capable of coping with a problem caused by level of a functional part such as terminal in a thickness direction independently of a metal support layer to improve product quality.

For this, the wiring circuit board has a raising structure in a thickness direction of a wiring layer, the raising structure provided to a functional part of the wiring layer independently of a metal support layer so that the functional part protrudes from a surface of a general part of the wiring layer or has a surface being flush with the surface of the general part.

The functional part may be a terminal, an aerial wiring part, or a reference-hole-forming part.

The terminal in the raising structure may be a flying lead facing an opening formed through the metal support layer and the electric insulating layer.

The aerial wiring part is a part of the wiring layer that passes over an opening formed through the metal support layer.

The reference-hole-forming part is a part of the wiring part to define a reference hole for image processing.

The method of manufacturing the wiring circuit board adds a raising layer to the metal support layer for forming the raising structure before the electric insulating layer is laid on the surface of the metal support layer.

In a case where the functional part is the terminal, the raising layer is added to a position of the metal support layer on which a part of the wiring layer to be the terminal is laid.

In a case where the functional part is the aerial wiring part, the raising layer is added to a position of the metal support layer on which a part of the wiring layer to be the aerial wiring part is laid.

In a case where the reference-hole-forming part is the functional part, the raising layer is added to a position of the metal support layer on which a part of the wiring layer to be the reference-hole-forming part is laid.

The raising layer is made of any one or any combination of insulating material, copper, nickel and chrome that are etched in a shorter time than the electric insulating layer.

Hereinafter, the embodiments of the present invention will be explained in detail with reference to drawings.

Figure 1:
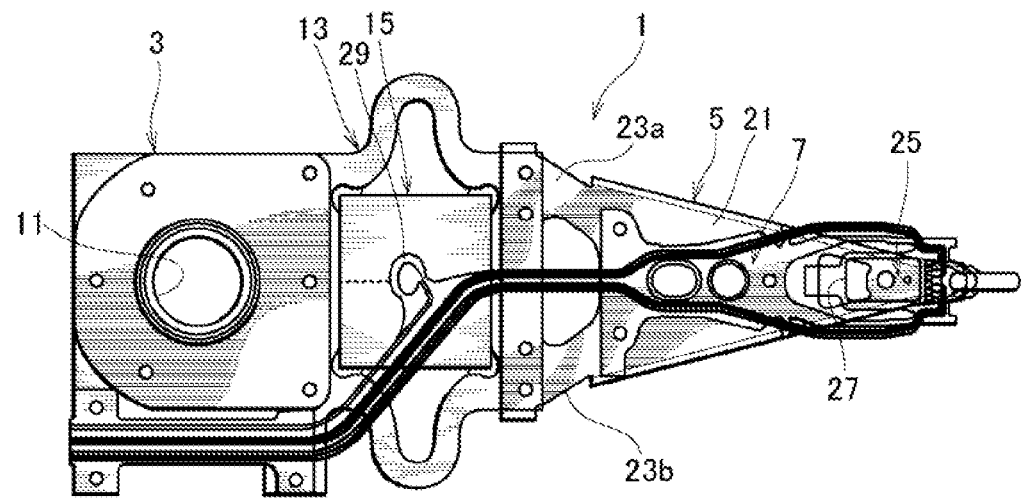
FIG. 1 is a plan view illustrating a head suspension viewed from a side on which a flexure is attached according to a first embodiment of the present invention.

FIG. 1 is a plan view illustrating a head suspension viewed from a side on which a flexure is attached according to the first embodiment of the present invention. In the following explanation, a direction along a turning radius of the head suspension is referred to as a longitudinal direction or a front and rear direction, a turning direction of the head suspension orthogonal to the longitudinal direction is referred to as a width direction or sway direction, and a direction along a turning axis is referred to as a thickness direction or up-and-down direction.

As illustrated in FIG. 1, the head suspension 1 includes a base plate 3, a load beam 5, a flexure 7, and a positioning actuator 9.

The base plate 3 is a component attached to a carriage (not illustrated) and is driven by the carriage to turn around a spindle. The base plate 3 is provided with a boss 11 that allows the base plate 3 to be attached to the carriage by ball caulking. To the base plate 3, the positioning actuator 9 is integrally attached.

The positioning actuator 9 displaces a head 25 (explained later) with respect to the base plate 3 in the sway direction to conduct positioning of the head 25. The positioning actuator 9 includes an actuator plate 13 and a piezoelectric element 15 attached to the actuator plate 13. The rear part of the actuator plate 13 is laid on the base plate 3 and is integrally connected thereto by laser spot welding or the like. To the front part of the actuator base 13, the load beam 5 is integrally connected by laser spot welding or the like.

The load beam 5 integrally includes a rigid part 21 and spring parts or resilient parts 23a and 23b. The resilient parts 23a and 23b are connected to the front part of the actuator base 13. The base end of the rigid part 21 is supported with the front part of the actuator base 13 through the resilient parts 23a and 23b. With this configuration, the load beam 5 applies load onto the read/write head 25 on the tip end (front end or head part) of the head suspension 1. To the rigid part 21, the flexure 7 is attached.

Figure 2:
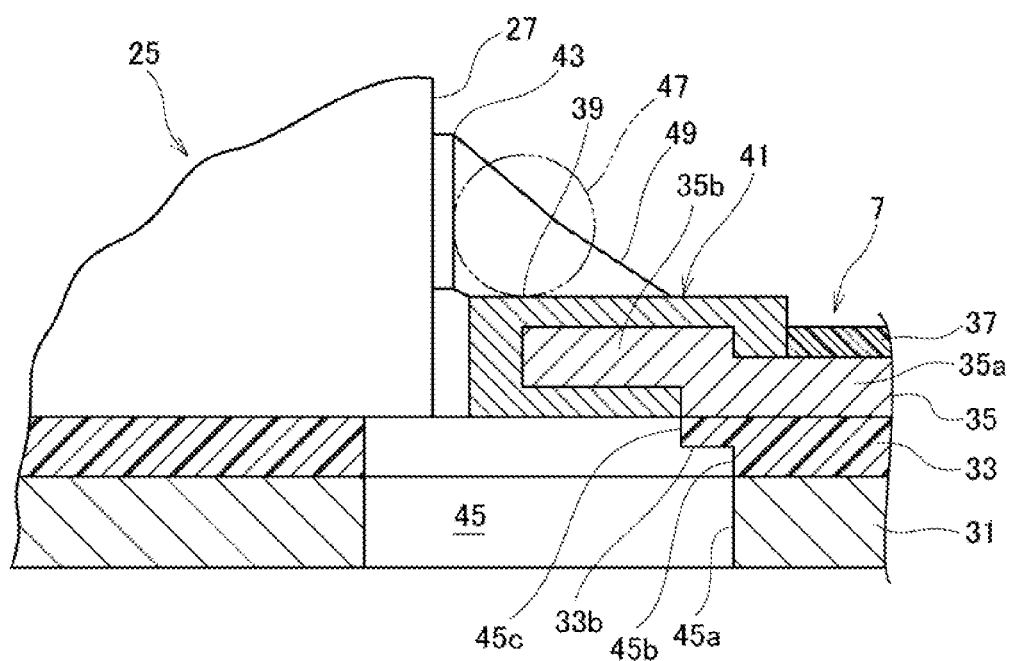
FIG. 2 is a schematic sectional view illustrating a connection between terminals at a head part of the flexure of FIG. 1.

The flexure 7 forms the wiring circuit board according to the embodiment and has a front end or head part to which a slider 27 is attached. The slider 27 configures a magnetic head or the head 25 having functions based on components of read/write elements, a heater for controlling a flying height, a head disk interface (HDI) sensor and the like that are incorporated into the slider 27 (FIG. 2). The slider 27 includes terminals 43 for the read/write elements, the heater for controlling a flying height, the head disk interface (HDI) sensor and the like. Corresponding to the terminals 43, terminals 35b are provided to wiring of the flexure 7. The terminals 35b are connected to the respective terminals 43 by soldering.

The flexure 7 extends from the head part or front end to the tail part or rear end on the base plate 3 side and passes over the positioning actuator 9 at the intermediate part between the head part and the tail part.

On the intermediate part, the flexure 7 has a terminal 29 that is electrically connected to an electrode of the piezoelectric element 15 through conductive paste.

Thus, the head suspension 1 is attached to the carriage with the boss 11, to be incorporated into a hard disk drive (HDD). The head suspension 1 in the HDD is turned by a voice coil motor of the carriage, to move the head 25 with the slider 27 on the hard disk. Then, the head 25 is positioned on a given track of the hard disk with the movement, to read or write information from and to the hard disk therethrough.

When the head 25 is positioned on the given track, the positioning actuator 9 minutely drives the head 25 in the sway direction to improve the positioning accuracy.

FIG. 2 is a sectional view schematically illustrating the connection between the terminals 35b and 43 at the head part of the flexure 7.

As illustrated in FIG. 2, the flexure 7 has a cross-section structure that includes a conductive thin plate 31, a base insulating layer 33 as an electric insulating layer laid or laminated on a surface of the conductive thin plate 31, a wiring layer 35 having a given wiring pattern and laid or laminated on a surface of the base insulating layer 33, and a cover insulating layer 37 covering the wiring layer 35 excepting the terminals 35b (explained later). The wiring pattern of the wiring layer 35 extends from the head 25 to the tail part as illustrated with thick lines in FIG. 1. In FIG. 1, the tail part of the flexure 7 is omitted.

The conductive thin plate 31 is made of a resilient thin metal plate such as a stainless steel rolled thin plate (SST) and serves as a metal support layer that forms a substrate. The conductive thin plate 31 has the thickness of about 10 to 25 µm. The base insulating layer 33 is made of insulating material such as polyimide and has the thickness of about 5-10 µm. The wiring layer 35 is made of conductive material such as copper and has the thickness of about 5-15 µm. The wiring layer 35 includes a general part 35a and terminals 35b.

The general part 35a of the wiring layer 35 is a part of the wiring layer 35 that is extended from the head 25 to the tail part of the flexure as illustrated in FIG. 1. The terminals 35b are connected to the general part 35a to provide an external conductive connection. The terminals 35b at the head 25 are electrically connected to the terminals 43 of the slider 27.

The cover insulating layer 37 is made of insulating material such as polyimide and covers the general part 35a of the wiring layer 35. The general part 35a is a part covered with the cover insulating layer 37 according to the embodiment. The general part 35a, however, means a part of the wiring layer 35 other than the terminals 35b and may not be covered with the cover insulating layer 37.

The terminals 35b are located at the front end of the general part 35a. According to the embodiment, each one terminal 35b is formed into a flying lead and is provided with a gold plate 39 spanning from a top surface to a bottom surface of the terminal 35b. The top surface and the bottom surface having the gold plate 39 form terminal surfaces, respectively. The flying lead according to the embodiment means a terminal that is not supported with the conductive thin plate 31 and the base insulating layer 33 by, for example, passing over an opening of the conductive thin plate 31 and the base insulating layer 33. The gold plate 39 is thickly indicated in the drawings for explanation. The gold plate 39, however, is actually made much thinner by plating. The gold plate 39 may be omitted.

The wiring layer 35 has a raising structure 41 in the thickness direction of the wiring layer 35. The raising structure 41 is provided to each one terminal 35b as the functional part for providing a given function. The raising structure 41 means a structure provided to the terminal 35b independently of the conductive thin plate 31 as the metal support layer, the structure in which the terminal 35b as a part of the wiring layer 35 is protruded from the surface of the general part 35a or has a surface flush with the surface of the general part 35a.

According to the embodiment, the raising structure 41 is formed independently of the conductive thin plate 31 only in the terminal 35b of the wiring layer 35 excluding the base insulating layer 33. The raising structure 41 of this embodiment arranges the terminal 35b to be protruded upward from the surface of the general part 35a and define a step between the general part 35a and the terminal 35b. The step between the general part 35a and the terminal 35b has a vertical wall perpendicular to the surface of the general part 35a and the surface of the terminal 35b in the drawings. The step, however, actually has a slope as a transition between the surfaces of the general part 35a and the terminal 35b without the vertical wall.

The conductive thin plate 31 is not involved with the raising structure 41, so that the raising structure 41 does not need to be subjected to machining operation of the related art and has high accuracy.

The conductive thin plate 31 that is not involved with the raising structure 41 means that the conductive thin plate 31 does not form a part of the raising structure 41 or does not raise the terminal 35b with bending of the conductive thin plate 31 conducted by machining operation.

As illustrated in FIG. 2, under the terminal 35b to which the raising structure 41 is applied in the thickness direction, there is an opening 45 and no part of the conductive thin plate 31 and the base insulating layer 33. The opening 45 may be omitted so that part of the conductive thin plate 31 and the base insulating layer 33 is located under the terminal 35b in the thickness direction unless machining such as bending of the conductive thin plate 31 is involved with the raising structure 41.

The conductive thin plate 31 may have parts subjected to machining operation unless these parts are involved with the raising structure 41. The base insulating layer 33 and the like that are not subjected to machining operation may be involved with the raising structure 41.

A raising structure in which a functional part has a surface flush with the surface of the general part 35a does not seemingly realize raising. This raising structure, however, raises a terminal relative to a dropped reference terminal, to adjust level of the terminal so as to cause a surface of the terminal to be flush with a surface of the general part 35a. The reference terminal is formed on a base insulating layer (base layer) made of photosensitive polyimide disclosed in JP2001-350272A to shorten etching time and is dropped down toward a conductive thin plate (support substrate) away from a slider. The embodiment for this structure will be explained later.

The raising structure 41 of the terminal 35b reduces a gap between the terminal 43 of the slider 27 and the terminal 35b of the wiring layer 35 to allow an appropriate welding fillet to be formed.

The number of the terminals 35b is, for example, ten according to the number of the terminals 43 of the slide 27. Each one terminal 35b is widened in the width direction relative to a part of the general part 35a adjoining to the terminal 35b. The terminal 35b may has the same width as the adjoining part of the general part 35a. In some cases, the terminal 35b may be narrower than the adjoining part of the general part 35a.

The terminal 35b faces the opening 45 formed through the conductive thin plate 31 and the base insulating layer 33. The opening 45 includes a first opening part 45a, a second opening part 45b and a third opening part 45c. The first opening part 45a spans in the thickness direction from the bottom surface of the conductive thin plate 31 to the top surface of the same. The second opening part 45b spans in the thickness direction from the bottom surface of the base insulating layer 33 to the middle part of the same. The third opening part 45c spans in the thickness direction from the middle part of the insulating layer 33 to the top surface of the same.

The first to third opening parts 45a, 45b and 45c may have various sizes and shapes to realize the flying lead. According to the embodiment, the first and second opening parts 45a and 45b have the same size in a plan view. The third opening part 45c is smaller than the first and second opening parts 45a and 45b due to a stepped projection 33b relative to the inner periphery of the second opening part 45b. Over the projection 33b, raising of the terminal 35b is started. The second opening part 45b has the depth of about 2-5 μm in a case where the base insulating layer 33 has the thickness of about 5-10 μm. The depth of the second opening part 45b may be changed according to design requirements.

The slider 27 that is a functional part of the head 25 is, for example, a Femto slider and has, for example, the ten terminals 43 that correspond to the read/write elements, the heater for controlling the flying height, the HDI sensor and the like according to the incorporated functions. The terminals 43 are arranged on a side face 27a of the slider 27 side by side in the width direction.

The head 25 is attached onto the flexure 7 so that the terminals 43 are approximately orthogonal to the corresponding terminals 35b located on the flexure 7 in cross section, respectively.

The corresponding terminals 35b and 43 are connected by soldering with the use of the solder ball 47 and a fillet 49 is formed between the corresponding terminals 35b and 43. A part of the fillet 49 on the terminal 43 extends from the upper end to the lower end of the terminal 43 and a part of the fillet 49 on the terminal 35b extends from the tip end of the terminal 35b to the base end of the same which is stepped relative to the general part 35a in the drawings. Between the terminals 43 and 35b, the fillet 49 has the sufficient width and thickness for a connection.

Figure 3:
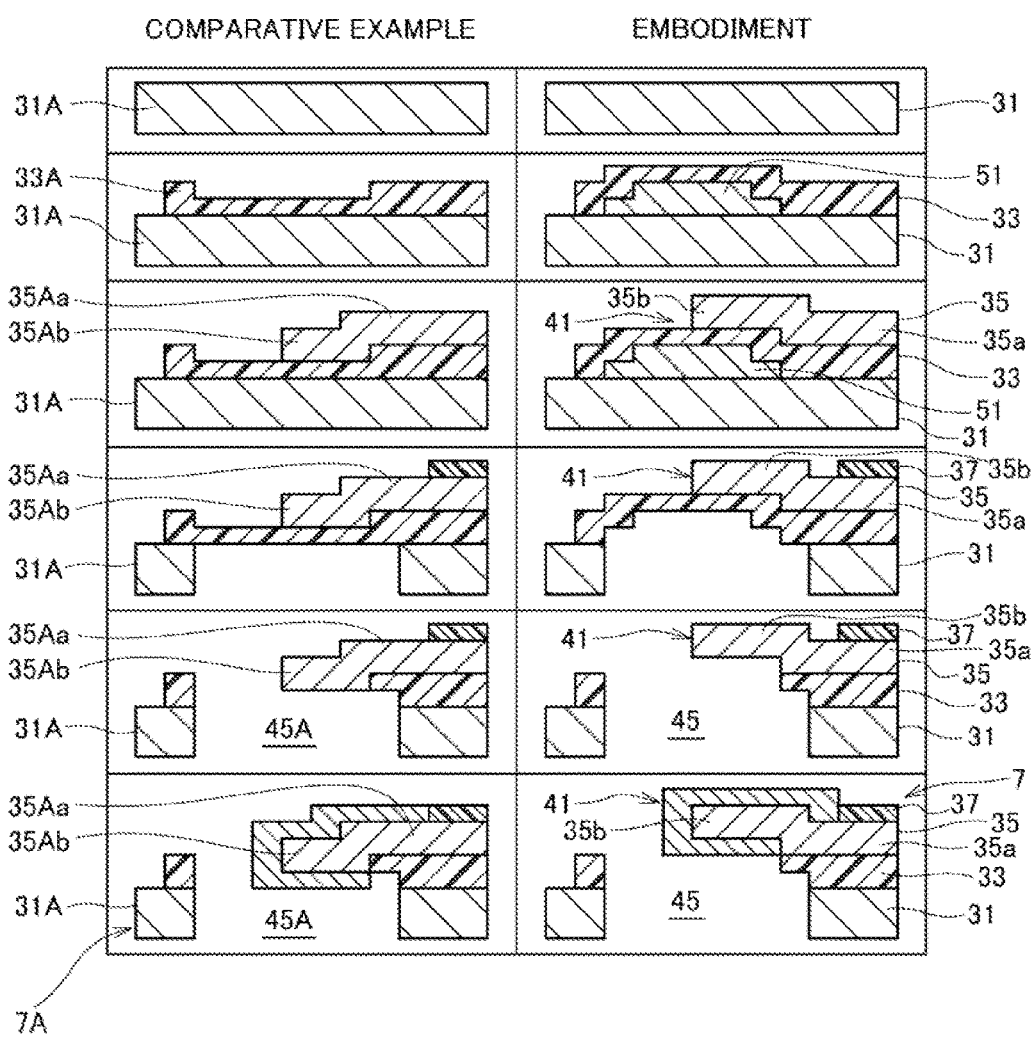
FIG. 3 is a table of schematic sectional views illustrating process steps for manufacturing flexures according to the first embodiment and a comparative example.

FIG. 3 is a table of schematic sectional views illustrating process steps for manufacturing flexures according to the first embodiment and a comparative example. FIGS. 4A, 5A, 6A, 7A and 8A are the sectional views of the second to sixth rows of FIG. 3 according to the comparative example, and FIGS. 4B, 5B, 6B, 7B and 8B are the sectional views of the second to sixth rows of FIG. 3 according to the first embodiment. Although the conductive thin plate 31, the base insulating layer 33 and the like are the semi-finished parts in the process steps of FIG. 3, the semi-finished parts are indicated with the same component names as the fished parts of the flexure 7 for convenience of explanation.

In FIG. 3, the method of manufacturing the wiring circuit board according to the embodiment adds a raising layer 51 to the conductive thin plate 31 for forming the raising structure 41 of FIG. 2 before the base insulating layer 33 as the electric insulating layer is laid on the surface of the conductive thin plate 31 as the metal support layer as illustrated in the second row of the right column of FIG. 3.

The material of the raising layer 51 is not limited as long as the raising is realized. Preferably, the raising layer 51 is made of any one or any combination of insulating material, copper, nickel and chrome that are etched in a shorter time than the base insulating layer 33.

The formation range of the raising layer 51 on the conductive thin plate 31 is set on a region on which a part of the wiring layer 35 to be each one terminal 35b is laid. The formation range, however, is not limited thereto as long as the terminal 35b is protruded from the surface of the general part 35a or has a surface flush with the surface of the general part 35a with the raising layer 51.

Figure 4A:
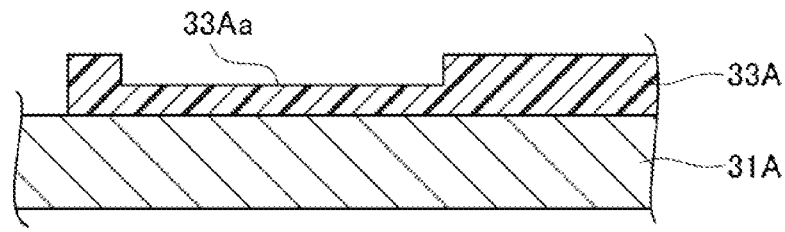
FIGS. 4A and 4B are the sectional views of the comparative example and the first embodiment of the second row of FIG. 3.
Figure 4B:
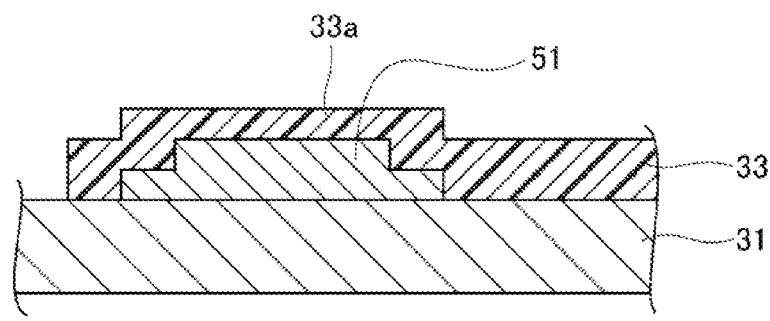

With the raising layer 51, the base insulating layer 33 has a raised part 33a as illustrated in FIG. 4B (the second row of the right column of FIG. 3). On the base insulating layer 33 with the raised part 33a, the wiring layer 35 is formed as illustrated in FIG. 5B (the third row of the right column of FIG. 3). Accordingly, it forms the raising structure 41 in which the terminal 35b is raised relative to the general part 35a.

Figure 6A:
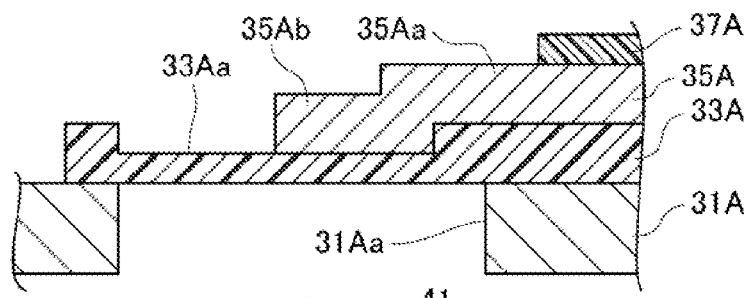
FIGS. 6A and 6B are the sectional views of the comparative example and the first embodiment of the fourth row of FIG. 3.
Figure 6B:
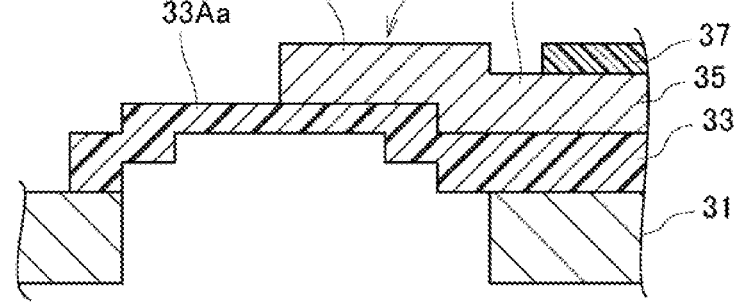
Figure 7A:
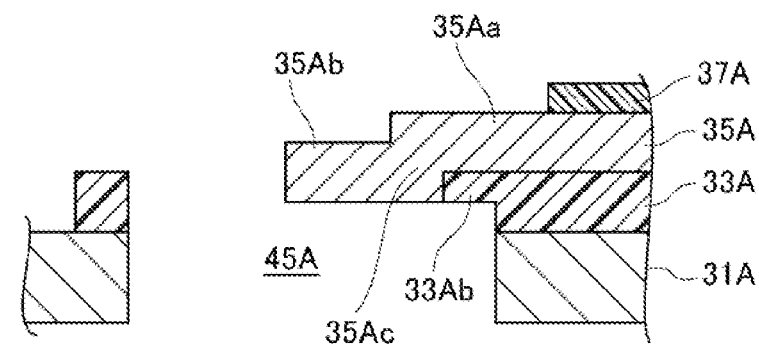
FIGS. 7A and 7B are the sectional views of the comparative example and the first embodiment of the fifth row of FIG. 3.
Figure 7B:
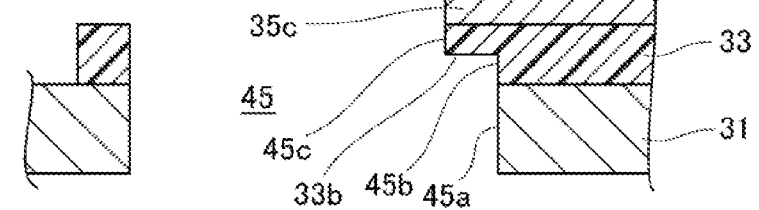

As illustrated in FIGS. 6B and 7B (the fourth and fifth rows of the right column of FIG. 3), the opening 45 is formed by etching so as to pass through the conductive thin plate 31 and the base insulating layer 33. With this, the raising layer 51 is removed.

The projection 33b remains on the base insulating layer 33 to protrude inward into the opening 45 and have the thickness thinner than that of the main part of the base insulating layer 33 by etching. The projection 33b supports the base end of the terminal 35b, i.e., a step part 35c between the general part 35a and the terminal 35b in the drawings. According to the embodiment, the base insulating layer 33 is involved with the raising structure 41 based on the projection 33b supporting the step part 35c. The cover insulating layer 37 is formed in the same time period as the opening 45.

Figure 8A:
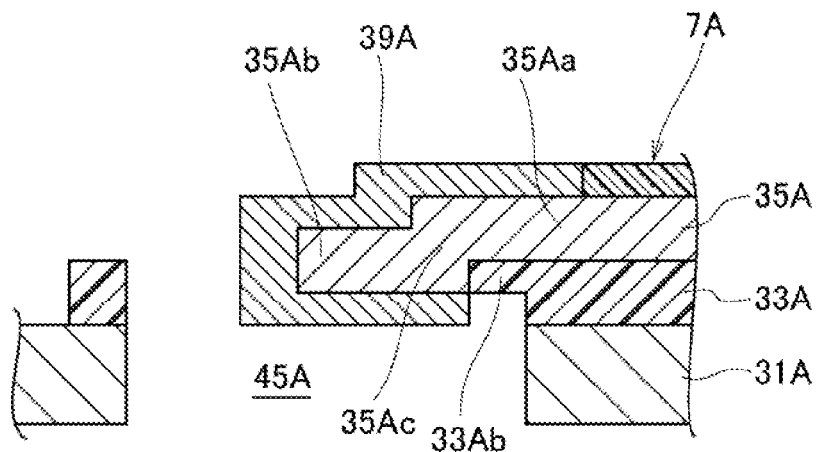
FIGS. 8A and 8B are the sectional views of the comparative example and the first embodiment of the sixth row of FIG. 3.
Figure 8B:
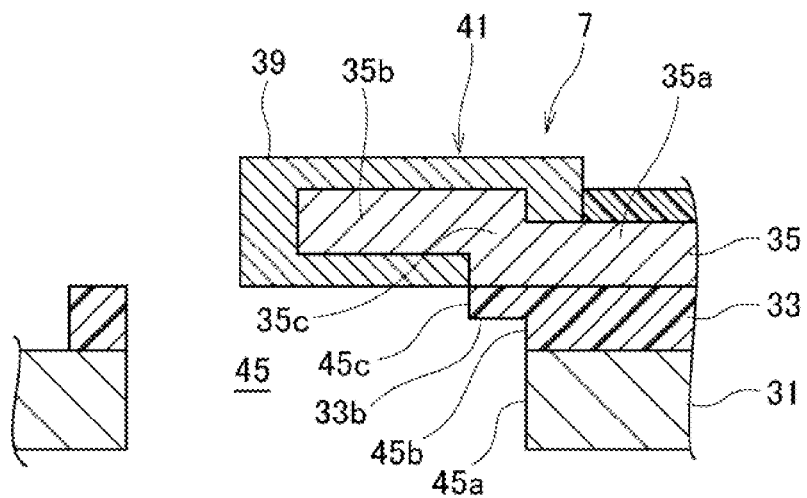

As illustrated in FIG. 8B (the sixth row of the right column of FIG. 3), the terminal 35b is covered with the gold plate 39 to be finished as the flying lead facing the opening 45 and finish the raising structure 41 independently of the conductive thin plate 31.

Figure 5A:
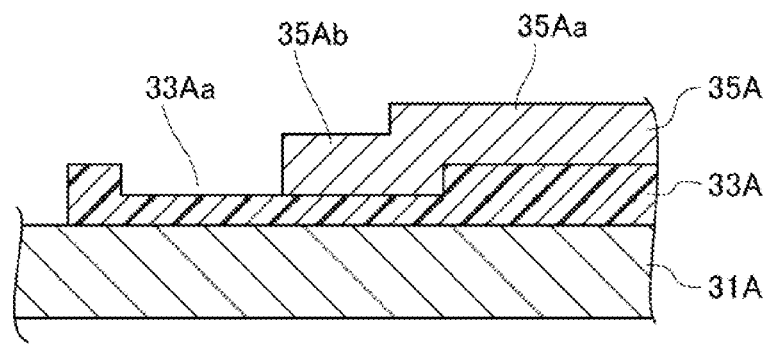
FIGS. 5A and 5B are the sectional views of the comparative example and the first embodiment of the third row of FIG. 3.
Figure 5B:
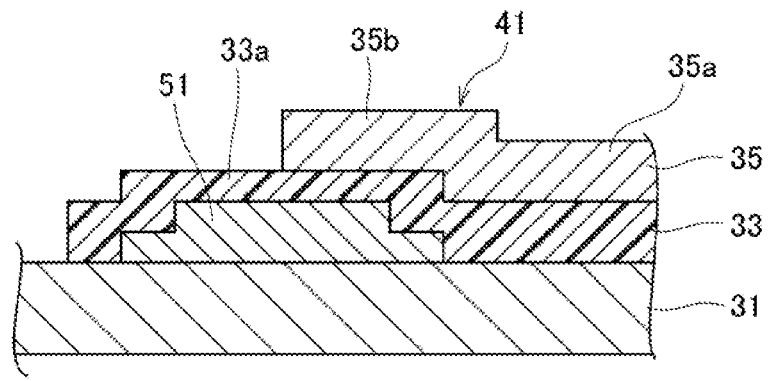

On the other hand, the comparative example of the left column of FIG. 3 does not add the raising layer 51 as illustrated in FIGS. 4A and 5A (the second and third rows of the left column of FIG. 3). Components or elements of the comparative example corresponding to those of the embodiment are represented with the same numerals with "A" to eliminate duplicate explanation.

When the comparative example forms the base insulating layer 33A on the conductive thin plate 31A without the raising layer 51, photosensitive polyimide is used to provide the base insulating layer 33A with a thinner part 33Aa than a main part through exposure in a region to be removed for forming the opening 45A as illustrated in FIG. 4A (the second row of the left column of FIG. 3). The thinner part 33Aa is to shorten etching time to form the opening 45A as illustrated in FIGS. 6A and 7A (the fourth and fifth rows of the left column of FIG. 3).

The comparative example, therefore, the wiring layer 35A is formed on the base insulating layer 33A having the thinner part 33Aa as illustrated in FIG. 5A (the third row of the left column of FIG. 3). With this, the terminal 35Ab is dropped down toward the base insulating layer 33A and has a stepped shape in the opening 45A when finishing the terminal 35Ab as the flying lead facing the opening 45A as illustrated in FIG. 8A (the sixth row of the left column of FIG. 3).

On the base insulating layer 33A, the projection 33Ab remains to protrude into the opening 45A. The projection 33Ab, however, never supports the step part 35Ac between the general part 35Aa and the terminal 35Ab of the wiring layer 35A.

As explained above, the method of manufacturing the wiring circuit board according to the first embodiment surely manufactures without machining operation the flexure 7 having the terminal 35b to which the raising structure 41 is provided independently of the conductive thin plate 31.

Namely, the flexure 7 manufactured by the method according to the first embodiment has the configuration in which the terminal 35b is protruded from the general part 35a on the top surface of the wiring layer 35. With this configuration, the gap between the terminal 35b of the flexure 7 and the terminal 43 of the slider 27 is reduced to easily form the fillet 49 having the sufficient thickness for a connection as illustrated in FIG. 2.

Figure 9:
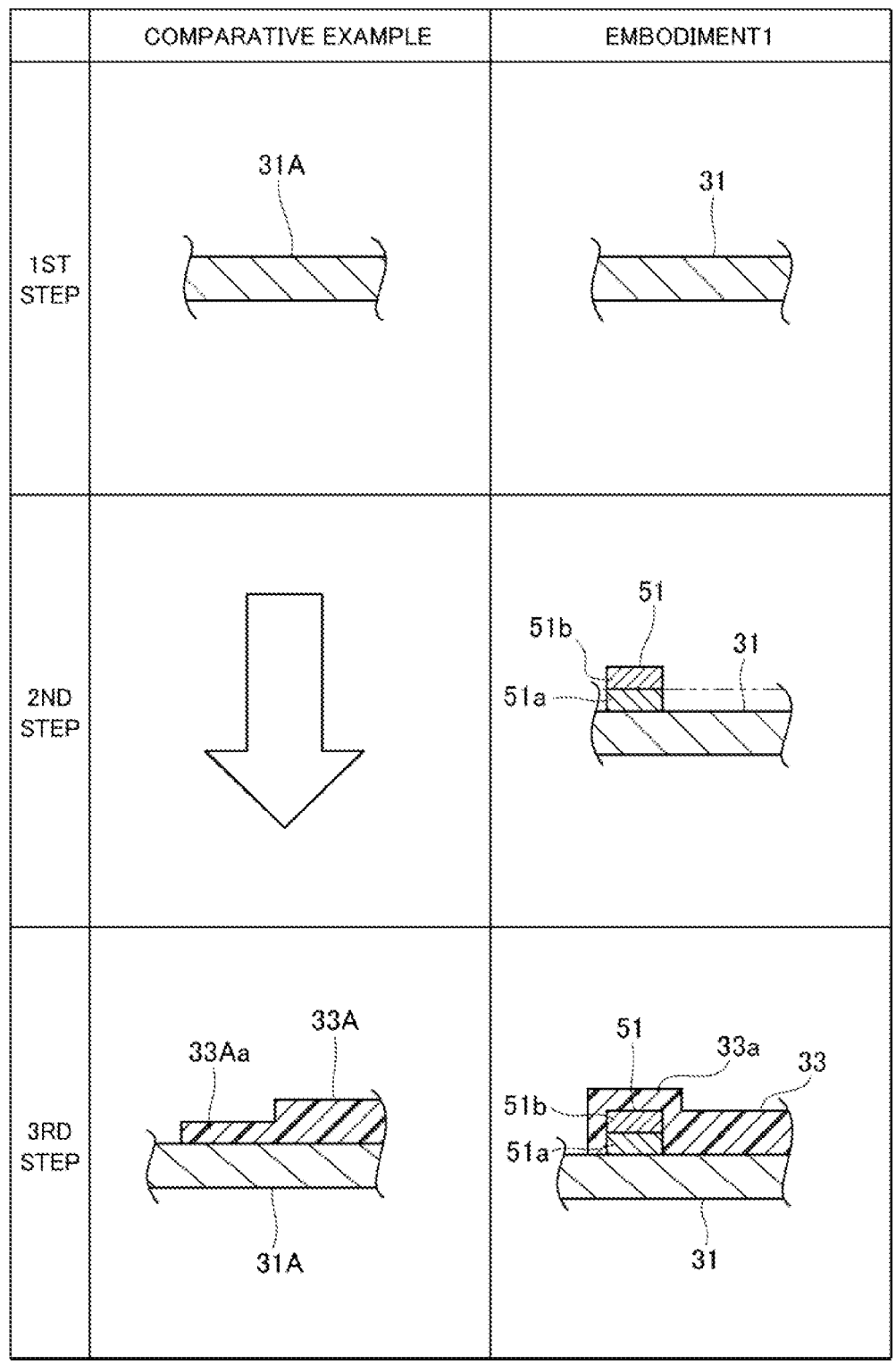
FIG. 9 is a table of sectional views illustrating detailed examples for the first to third steps of FIG. 3 according to the comparative example and the first embodiment.
Figure 10:
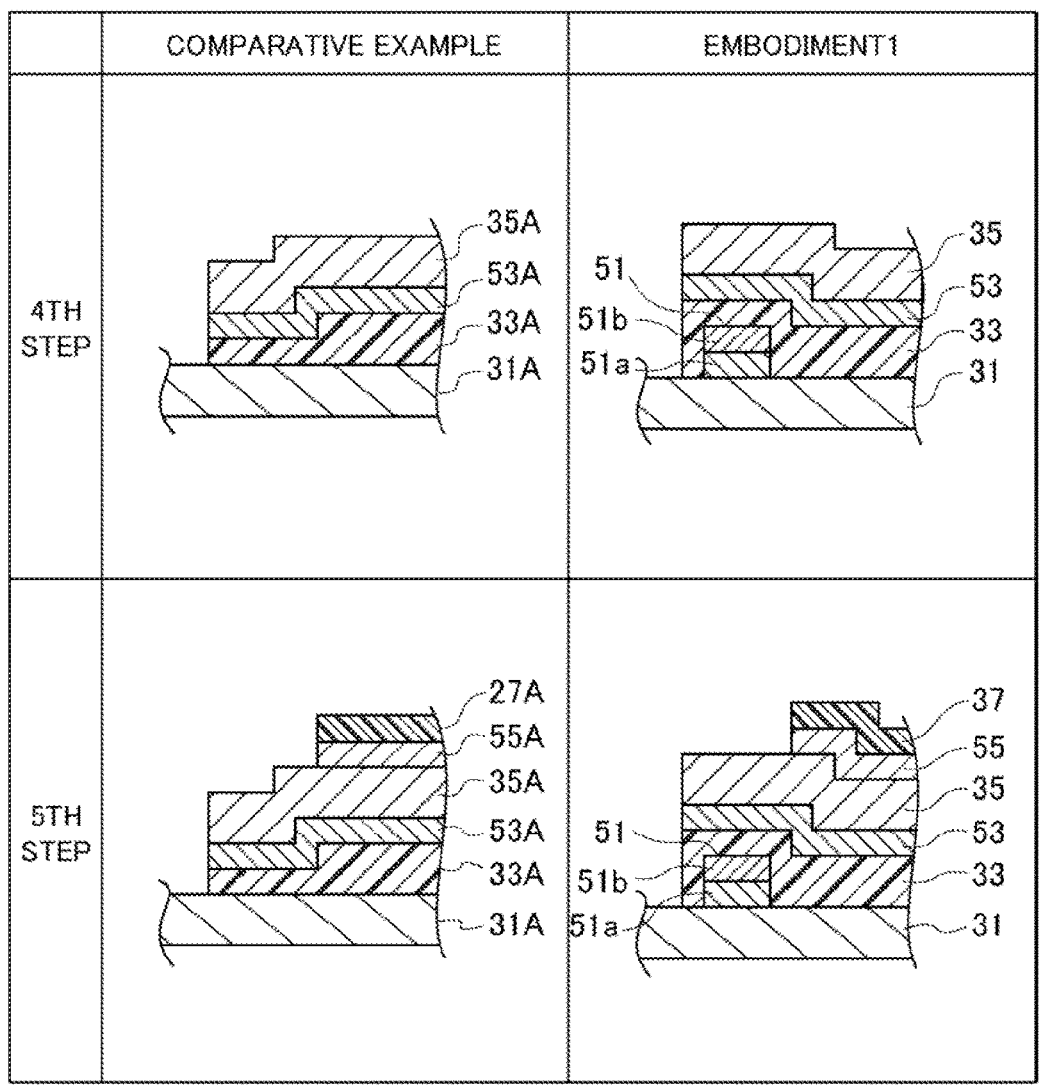
FIG. 10 is a table of sectional views illustrating detailed examples for the fourth to fifth steps of FIG. 3 according to the comparative example and the first embodiment.
Figure 11:
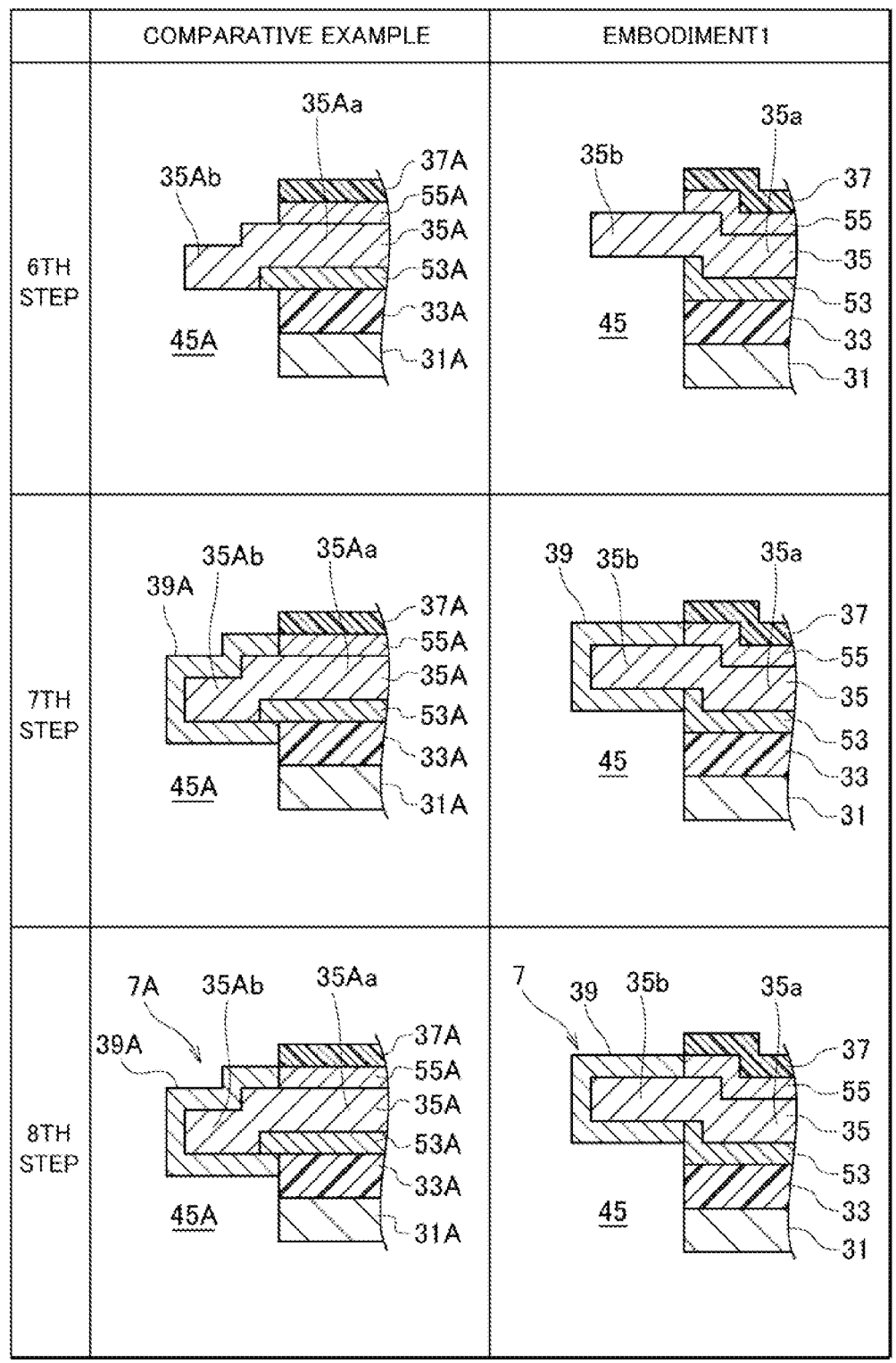
FIG. 11 is a table of sectional views illustrating detailed examples for the sixth to eighth steps of FIG. 3 according to the comparative example and the first embodiment.

FIGS. 9 to 11 are tables of sectional views illustrating detailed examples for the steps of FIG. 3 according to the comparative example and the first embodiment, in which FIG. 9 is for the first to third steps, FIG. 10 for the fourth and fifth steps and FIG. 11 for the sixth to eighth steps. Other detailed examples may be employed to form the raising structure 41.

In FIGS. 9 to 11, the method according to the embodiment will be explained by comparison with the comparative example. Similar to the FIGS. 3A to 8B, the semi-finished parts are indicated with the same component names as the fished parts of the flexure 7 for convenience of explanation and the components or elements of the comparative example in the left column are represented with the reference numerals of the right column with "A". In FIGS. 9 to 11, the structure or shape is substantially the same as that of FIGS. 2 to 8B while having minor differences.

The method according to the embodiment forms the raising layer 51 and then stacks the base insulating layer 33, the wiring layer 35 and the cover insulating layer 37 on the conductive thin plate 31 in this order. Finally, the method forms the conductive thin plate 31 into a shape following the flexure 7. With this, the method handles a situation that the flexure 7 may have a complicated structure.

As illustrated in FIG. 9, the first step prepares the conductive thin plate 31, 31A having a band shape with a given width in both the first embodiment and the comparative example.

The second step in the first embodiment lays or stacks a spatter layer 51a and a step layer 51b as the raising layer 51 on a part of the surface of the prepared conductive thin plate 31 in this order. The spatter layer 51a is made of chrome and copper and the step layer 51b is made of copper.

In particular, the second step of the first embodiment forms the spatter layer 51a on the whole surface of the conductive thin plate 31 by spattering as illustrated with the two-dot chain line. Then, the step layer 51b is formed on a part of the surface of the spatter layer 51a using a resist that has an opening corresponding to said part of the surface of the spatter layer 51a. When forming the step layer 51b, the entire height of the raising layer 51 is adjusted according to the height of the step layer 51b. Next, the resist is separated from the spatter layer 51a and etching is conducted to remove the part of the spatter layer 51a illustrated with the two-dot chain line and obtain the completed spatter layer 51a illustrated with the continuous line.

On the other hand, the comparative example lacks such a second step and performs the third step after the first step.

The third step of the first embodiment applies a polyimide precursor of photosensitive polyimide to the surface of the conductive thin plate 31 having the raising layer 51. Then, exposure is conducted to the polyimide precursor using a photomask to cure the polyimide precursor, so that the base insulating layer 33 made of polyimide is formed along the shape of the flexure 7 of FIG. 1 and is provided with the raised part 33a.

The comparative example in third step also applies a polyimide precursor of photosensitive polyimide to the surface of the conductive thin plate 31A and then performs exposure to the polyimide precursor to cure the same. The comparative example, however, forms the thinner part 33Aa than the other part of the base insulating layer 33A according to adjustment of the exposure to allow etching of the sixth step to be conducted in a shorter time. The first and second steps of this embodiment form the raised part 33a of the insulating layer 33 thinner than the other part of the insulating layer 33 due to the raising layer 51.

As illustrated in FIG. 10, the fourth step in the first embodiment and the comparative example forms the spatter layer 53, 53A made of chrome and copper on the base insulating layer 33, 33A. On the spatter layer 53, 53A, the fourth step forms a patterned resist and also the wiring layer 35, 35A by copper plating along the shape of the flexure 7 of FIG. 1. Then, the resist is separated from the spatter layer 53, 53A and unnecessary parts of the spatter layer 53, 53A are removed by etching.

The fifth step in the first embodiment and the comparative example forms a nickel plate 55, 55A by, for example, electroless nickel plating and the cover insulating layer 37, 37A on the nickel plate 55, 55A so as to cover the wiring layer 35, 35A. Then, unnecessary parts of the nickel plate 55, 55A are removed.

As illustrated in FIG. 11, the sixth step of the first embodiment forms the opening 45 by etching the conductive thin plate 31, the spatter layer 51a and the step layer 51b of the raising layer 51, the base insulating layer 33 and the spatter layer 53. This step may use an etching liquid capable of simultaneously etching copper and chrome or copper, chrome and stainless steel. For the etching of the base insulating layer 33, a different etching liquid is used. In this etching, the raising layer 51 has been removed and therefore etching time for the base insulating layer 33 is shortened. With this etching, the terminal 35b faces the opening 45 due to the raising structure 41.

The sixth step of the comparative example forms the opening 45A by etching the conductive thin plate 31A, the base insulating layer 33 A and the spatter layer 53A in the same way. In this etching, since a part to be etched is the thinner part 33Aa than the other part of the base insulating layer 33A, etching time to remove the thinner part 33Aa is shortened. The terminal 35Ab, however, is not raised and drops down toward the conductive thin plate 31A in the opening 45A.

The seventh step in the first embodiment and the comparative example forms a resist to build the gold plate 39, 39A by gold plating after nickel fundamental plating to cover the top and bottom surfaces of the terminal 35b, 35Ab. Then, the resist is separated.

The eighth step in the first embodiment and the comparative example forms a resist to finally shape the contour of the conductive thin plate 31, 31A following that of the flexure 7 of FIG. 1 by etching. Then, the resist is separated to complete the flexure 7. The terminals 35b and 35Ab in the seventh and eighth steps are not changed and the seventh and eighth steps in FIG. 11 are the same.

In this way, the first embodiment provides the terminal 35b with the raising structure 41 independently of the conductive thin plate 31 or without machining operation such as bending of the conductive thin plate 31 with the first to eighth steps of FIGS. 9-11. On the other hand, though the comparative example provides the terminal 35Ab independently of the conductive thin plate 31A or without machining operation such as bending the conductive thin plate 31A, the comparative example results in dropping the terminal 35Ab toward the conductive thin plate 31A in the opening 45A.

As explained above, the flexure 7 as the wiring circuit board according to the embodiment includes the conductive thin plate 31, the base insulating layer 33 laid on the surface of the conductive thin plate 31, the wiring layer 35 having the general part 35a laid on the surface of the base insulating layer 33 and the terminal 35b connected to the general part 35a as the functional part to provide the conductive connection to the external slider 27, and the raising structure 41 in the thickness direction provided to the terminal 35a independently of the conductive thin plate 31 so that the terminal 35b protrudes from the surface of the general part 35a on the top surface of the wiring layer 35.

Accordingly, the first embodiment provides the accurate raising structure 41 to the terminal 35b without variation in positioning accuracy of the terminals 35b due to machining operation such as bending conducted to the conductive thin plate 31.

As a result, even if each one terminal 35b of the flexure 7 and each one terminal 43 of the slider 27 are downsized to require a smaller solder ball 47 than usual, each one terminal 35b is put close to the corresponding terminal 43 enough for the smaller solder ball 47 according to the raising structure 41 as illustrated in FIG. 2. The first embodiment, therefore, forms the fillet 49 with the sufficient width and thickness not to cause a connection failure at the time of solder bonding with the use of the smaller solder ball 47. This improves reliability of the connection.

Further, the method of manufacturing the flexure 7 as the wiring circuit board according to the first embodiment adds the raising layer 51 to the conductive thin plate 31 for forming the raising structure 41 at a part on which a part of the wiring layer 35 to be the terminal 35b is laid before the base insulating layer 33 is laid on the surface of the conductive thin plate 31.

Accordingly, the raising structure 41 is surely and easily formed without machining operation. Further, the method forms the raising layer 51 using material that are etched in a shorter time than the base insulating layer 33 that is made of photosensitive polyimide. This also allows etching time of the base insulating layer 33 to be shortened.

The raising layer 51 is made of copper, chrome or the like and therefore it enables to use the etching liquid capable of simultaneously etching the raising layer 51 and the conductive thin plate 31 made of stainless steel. This eliminates etching time only for the raising layer 51.

Figure 12A:
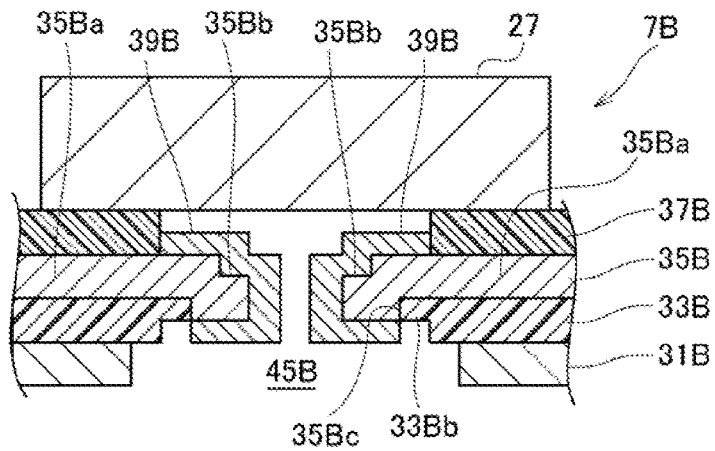
Figure 12B:
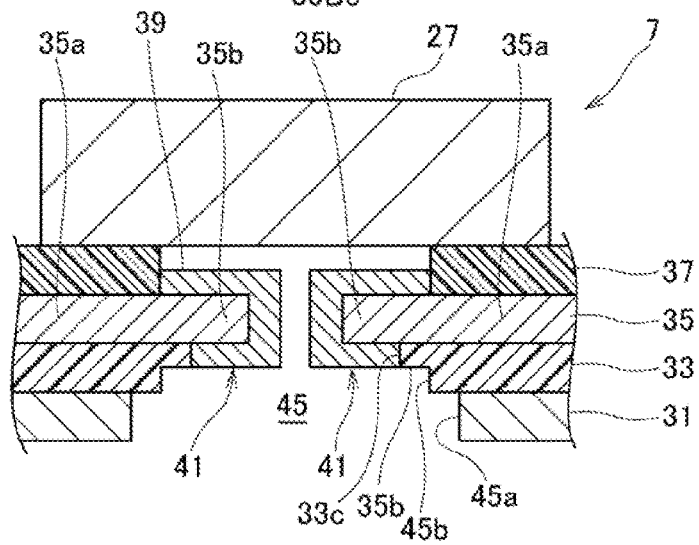
Figure 12C:
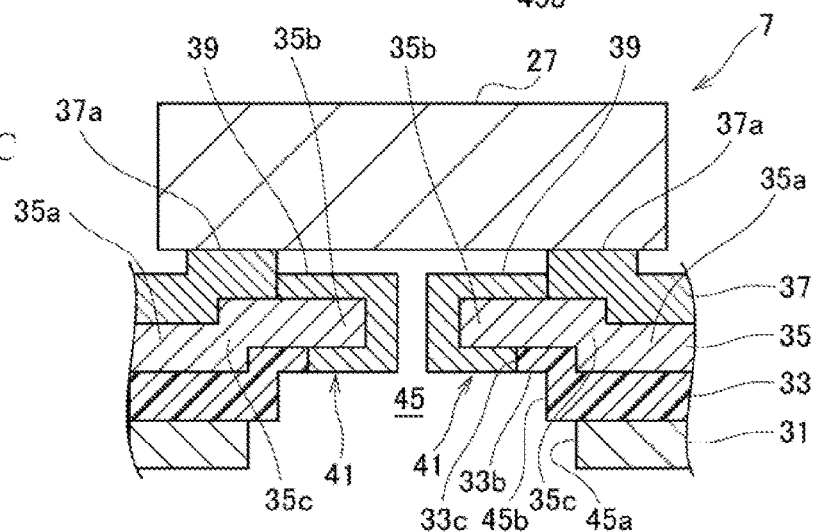

FIGS. 12A to 12C are sectional views illustrating respective connection structures on top faces of tongues in which FIG. 12A is a comparative example, FIG. 12B is a modification having terminals 35b being put closer to the slider 27 according to the first embodiment and FIG. 12C is another modification raising level of the slider 27 according to the first embodiment. Components or elements of the comparative example and the modifications corresponding to the first embodiment are represented with the same reference numerals or the same reference numerals with "B" to eliminate duplicate explanation.

FIGS. 12A to 12C are of a top-bonded-type. This type has the terminals 35b and 35Bb arranged beneath the slider 27 instead of the side thereof. The solder bonding is vertically performed.

The flexure 7B according to the comparative example of FIG. 12A is manufactured by a method similar to that of the comparative example of the flexure 7A explained above. Accordingly, a part of the terminal 35Bb used for soldering drops away from the bottom surface of the slider 27.

The modifications of FIGS. 12B and 12C have raising structures 41 provided to terminals 35b, respectively. In each of FIGS. 12B and 12C, two different terminals 35b are symmetrically arranged.

According to the modification of FIG. 12B, the general part 35a and the terminals 35b are flatly continuous to each other. Namely, the surface of each one terminal 35b is flush with the surface of the general part 35a. The projections 33b are provided to the inner periphery of the opening 45 and each one projection 33b supports the base end of the corresponding terminal 35b.

According to the modification of FIG. 12C, the terminals 35b protrude from the general part 35a on the top surface of the wiring part 35 to define the steps 35c. Each one step 35c is deviated from the corresponding projection 33b and is located above an edge part of the conductive thin plate 31 defining the opening 45. On each one step 35c, a protrusion 37a of the cover insulating layer 37 is formed to support the slider 27.

In the modifications of FIGS. 12B and 12C, process sptes similar to those of the first embodiment explained above are performed to have the raising structure 41. The method according to the modifications adds the raising layer (not illustrated) to the conductive thin plate 31 before the base insulating layer 33 is formed. Then, the polyimide precursor of photosensitive polyimide is applied to the conductive thin plate 31 having the raising layer and is subjected to exposure to form the base insulating layer 33. In this state, a part of the base insulating layer 33 over the raising layer is a flat or raised part according to height of the raising layer. In each case, the raising layer to be removed by etching is present in the flat or raised part before the etching.

The method, therefore, forms the terminal 35b into a selected shape of FIG. 12B or 12C by adjusting the height of the raising layer.

Each modification has the terminal 35b closer to the bottom surface of the slider 7 than the comparative example. Further, the modification of FIG. 12C raises the mounting position of the slider 27.

Figure 13A:
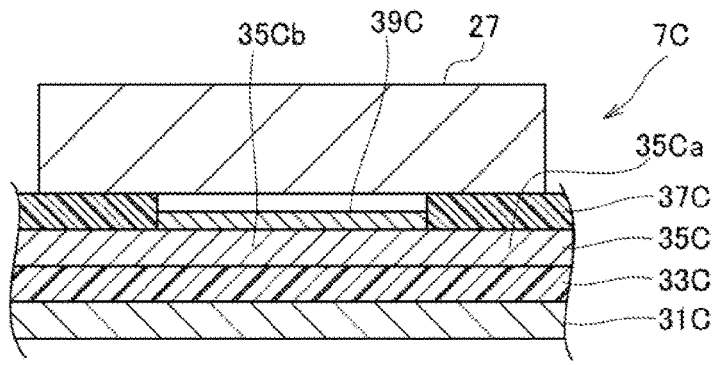
Figure 13B:
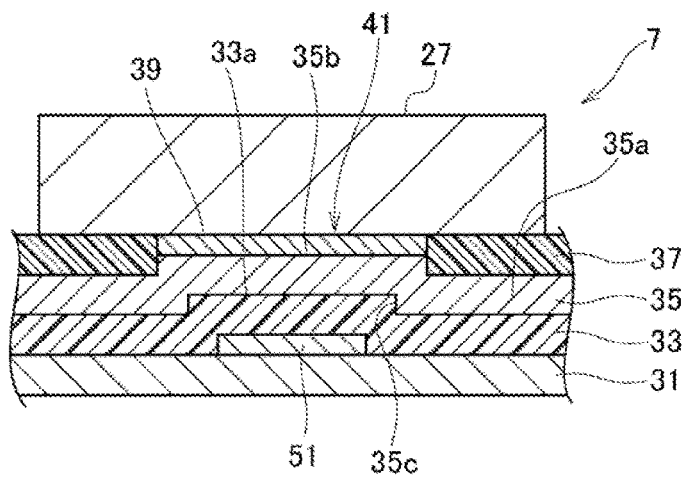
Figure 13C:
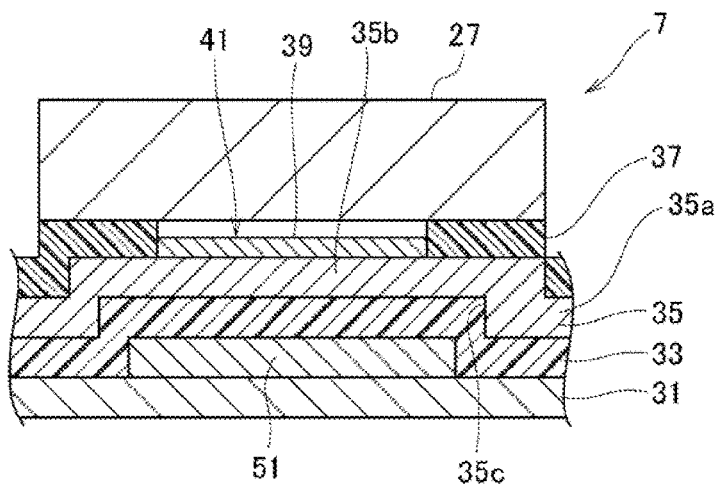

FIGS. 13A to 13C are sectional views illustrating respective connection structures on top faces of tongues in which FIG. 13A is a comparative example, FIG. 13B is still another modification having terminals 35b being put closer to a slider 27 according to the first embodiment and FIG. 13C is still another modification raising level of a slider 27 according to the first embodiment. Corresponding components or elements of the comparative example and the modifications corresponding to the first embodiment are represented with the same reference numerals or the same reference numerals with "C" to eliminate duplicate explanation.

FIGS. 13A to 13C are of a top-bonded-type like FIGS. 12A to 12C.

The flexure 7C according to the comparative example of FIG. 13A has the terminal 35Cb that is a part of the wiring layer 35C exposed through a window formed through the cover insulating layer 37C. The terminal 35Cb is connected to a terminal on the bottom surface of the slider 27 facing the terminal 35Cb. In this structure, it is required to thin the cover insulating layer 37C or thicken the gold plate 39C in order to reduce a gap between the terminal 35Cb and the bottom surface of the slider 27. The cover insulating layer 37C, however, needs to have the thickness of about 3 μm to secure its function and the gold plate 39C needs to have 1 μm to reduce the cost. As a result, the gap between the terminal 35Cb and the bottom surface of the slider 27 is about 2 μm and is not further reduced.

In the modification of FIG. 13B, the raising structure 41 is provided to the terminal 35b to adjust the gap between the terminal 35b and the bottom surface of the slider 27.

In particular, the raising layer 51 is arranged on the conductive thin plate 31 within a range of the window of the cover insulating layer 37 in a plan view. According to the raising layer 51, the base insulating layer 33 has the raised part and the terminal 35b is protruded from the general part 35a into the window of the cover insulating layer 37. The terminal 35b has the gold plate 39 on the top surface and is in contact with the bottom surface of the slider 27.

As illustrated FIG. 13C, the raising layer 51 is expanded to the inside and the outside of the window of the cover insulating layer 37 in a plan view. Though the modification has the same gap between the terminal 35b and the bottom surface of the slider 27 as that of the comparative example, it raises the mounting position of the slider 27 relative to the comparative example.

In the modifications of FIGS. 13B and 13C, the method according to the modification performs process steps similar to those of the first embodiment explained above to provide the terminal 35b with the raising structure 41. The method according to the modifications adds the raising layer 51 to the conductive thin plate 31. Then, the polyimide precursor of photosensitive polyimide is applied to the conductive thin plate 31 having the raising layer 51 and is subjected to exposure to form the base insulating layer 33. Through this base insulating layer 33, the terminal 35b to which the raising structure 41 is applied is formed.

The structure in which the raising layer 51 is formed like FIG. 13B is not applicable to the flying-lead terminal 35b of FIG. 2 but a pad-type terminal. The pad-type terminal 35b means a terminal supported with the conductive thin plate 31 and the base insulating layer 33 from the back or bottom as illustrated in FIG. 13B. The pad-type terminal 35b is realized by, for example, conducting the first to fifth steps of the first embodiment to form the raising layer 51 and thereafter conducting the seventh step to form the gold plate 39 without the sixth step of the first embodiment.

The wiring circuit board is not limited to the flexure 7 but any other electric part to which the raising structure is applicable. The same holds for the other embodiments.

The raising structure may be provided to any other functional part in the flexure 7, for example, the terminal 29 of the positioning actuator 9 as the terminal of the flexure 7. In this case, the raising structure secures the electric connection between the terminal 29 and the piezoelectric element 15 while reducing the amount of the conductive paste such as silver paste to be applied.

Figure 14:
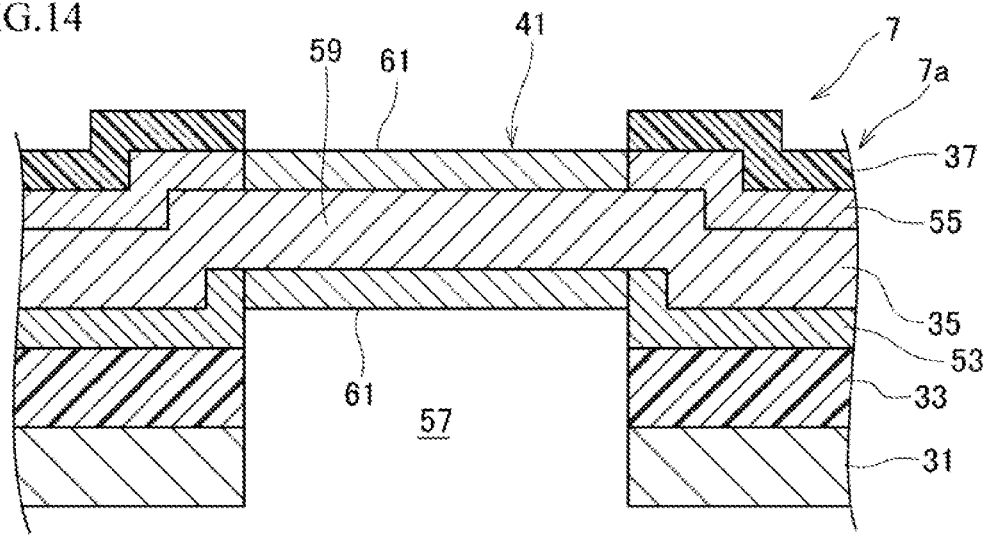
FIG. 14 is a sectional view illustrating a flying lead at a tail part of a flexure according to a second embodiment.

FIG. 14 is a sectional view illustrating a flying lead at a tail part 7a of a flexure 7 according to the second embodiment. Components or elements corresponding to those of the first embodiment are represented with the same reference numerals as those of the first embodiment to eliminate duplicate explanation.

As illustrated in FIG. 14, the wiring layer 35 on the tail part 7a has a flying lead 59 passing over an opening 57 formed through the conductive thin plate 31 and the base insulating layer 33. The flying lead means a terminal that is not supported with the conductive thin plate 31 and the base insulating layer 33 by, for example, passing over the opening 57 of the conductive thin plate 31 and the base insulating layer 33 like the first embodiment. The flying lead 59 is provided with a gold plate 61 on the top and bottom surfaces and a raising structure 41.

In FIG. 14, a method according to the second embodiment to provide the raising structure 41 to the flying lead 59 conducts process steps similar to those of the first embodiment. The method, therefore, forms the raising layer (not illustrated) on the conductive thin plate 31 before forming the base insulating layer 33. Then, the method applies the polyimide precursor of photosensitive polyimide on the conductive thin plate 31 and cure the same to form the base insulating layer 33. Thereafter, the method conducts etching and the like to complete the flying lead 59 to which the raising structure 41 is applied.

The second embodiment, therefore, adjusts the level of the flying lead 59 relative to a terminal of a main flexible circuit board, thereby to allow solder bonding to be appropriately conducted.

Figure 15A:
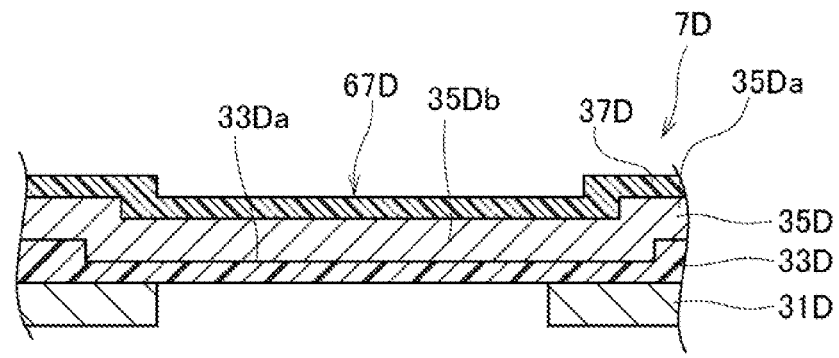
FIGS. 15A and 15B are sectional views illustrating aerial wiring parts according to a comparative example and a third embodiment of the present invention, respectively.
Figure 15B:
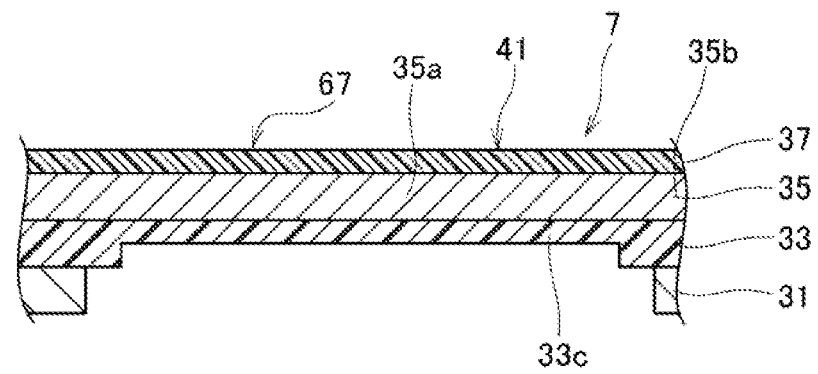

FIGS. 15A and 15B are sectional views illustrating aerial wiring parts according to a comparative example and the third embodiment of the present invention, respectively. Components or elements of the third embodiment and the comparative example corresponding to those of the first embodiment are represented with the same reference numerals or the same reference numerals with "D", to eliminate duplicate explanation.

As illustrated in FIG. 15A, an aerial wiring part 67D of the comparative example has a base insulating layer 33D with a recess formed by exposure on a top surface and the wiring layer 35D drops toward the conductive thin plate 31D. The aerial wiring part means a part of the wiring layer passing over the opening of the conductive thin plate, being not supported with the conductive thin plate and being not a terminal. According to the embodiment, part of the base insulating layer and the cover insulating layer passing over the opening of the conductive thin plate may be included in the aerial wiring part as well as said part of the wiring layer.

According to the flexure 7 of the third embodiment of FIG. 15B, the raising structure 41 is provided to the aerial wiring part 67 as the functional part. The base insulating layer 33 of the aerial wiring part 67 has a thin part 33c defined by a recess on the bottom surface and having a flat top surface. On the top surface of the base insulating layer 33, the wiring layer 35 is laid to have a flat top surface. On the top surface of the wiring layer 35, the cover insulating layer 37 is laid.

The method according to the embodiment to provide the aerial wiring part 67 with the raising structure 41 in FIG. 15B conducts process steps similar to those of the first embodiment. The method, therefore, adds the raising layer (not illustrated) to the conductive thin plate 31 before forming the base insulating layer 33. Then, the method applies the polyimide precursor of photosensitive polyimide on the conductive thin plate 31 and cure the same to form the base insulating layer 33. Thereafter, the method removes the raising layer through etching of part of the conductive thin plate 31 to define the thin part 33c. This provides the aerial wiring part 67 with the raising structure 41 in which the general part 35a of the wiring layer 35 in the aerial wiring part 67 is flush with the general part 35a of the wiring layer 35 in an adjoining non-aerial wiring part.

In this way, the third embodiment forms the general part 35a of the aerial wiring part 67 flush with the general part 35a of the adjoining non-aerial wiring part to stabilize rigidity of the flexure 7.

Figure 16A:
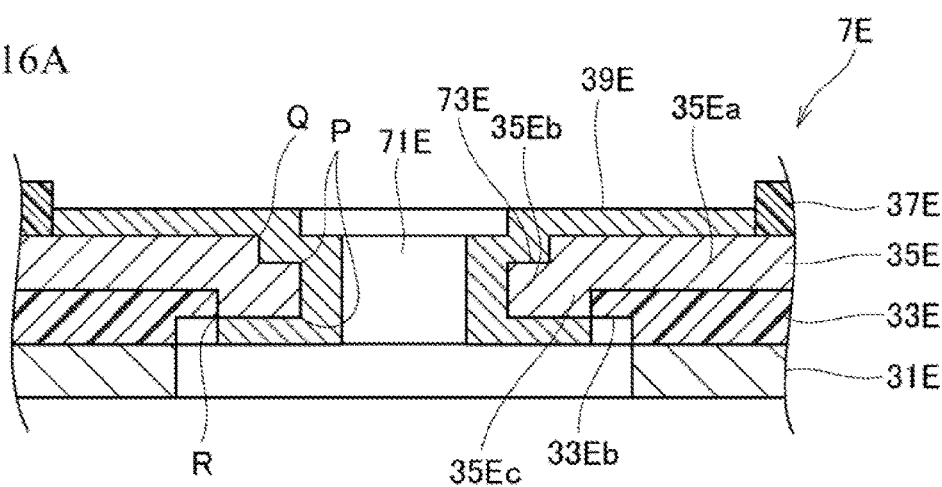
FIGS. 16A and 16B are sectional views illustrating reference holes for positioning according to a comparative example and a fourth embodiment of the present invention, respectively.
Figure 16B:
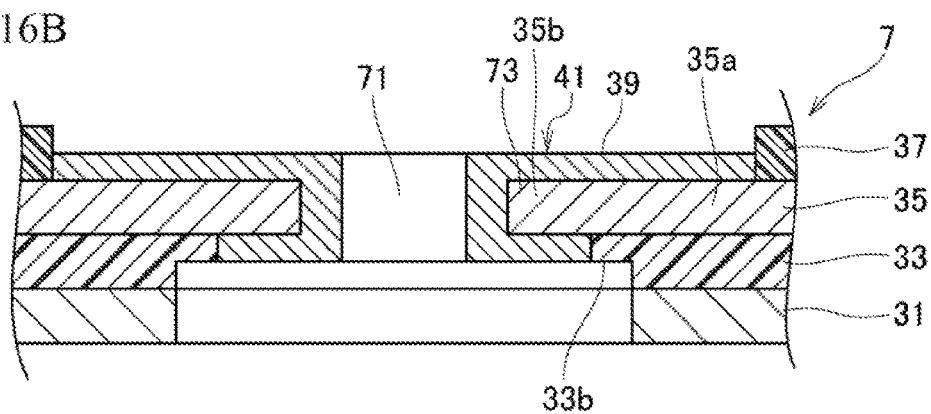
Figure 17A:
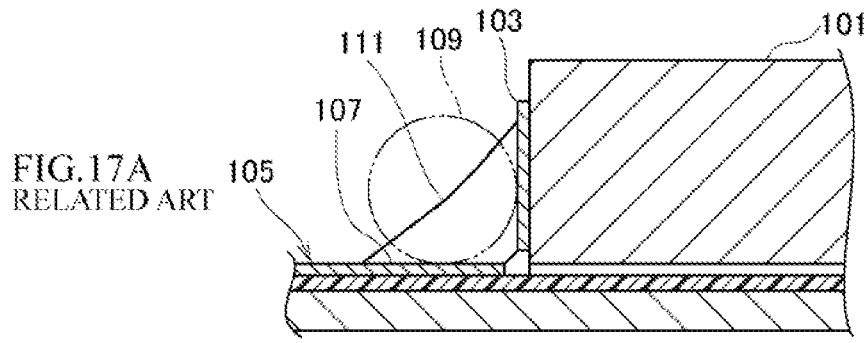
Figure 17B:
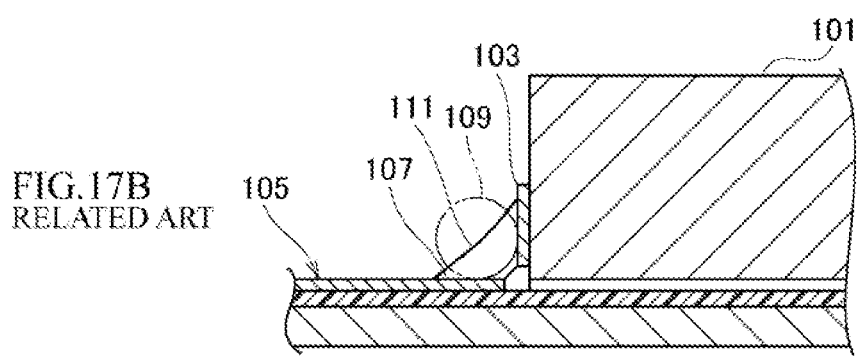
Figure 18A:
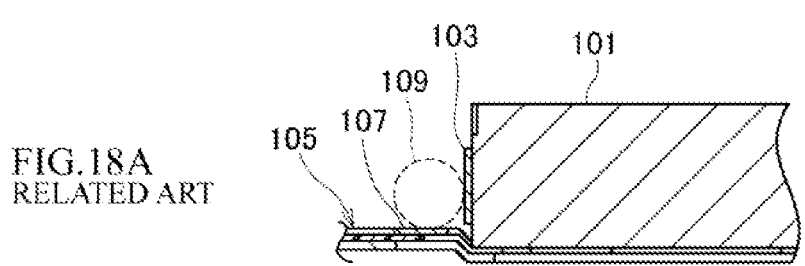
Figure 18B:
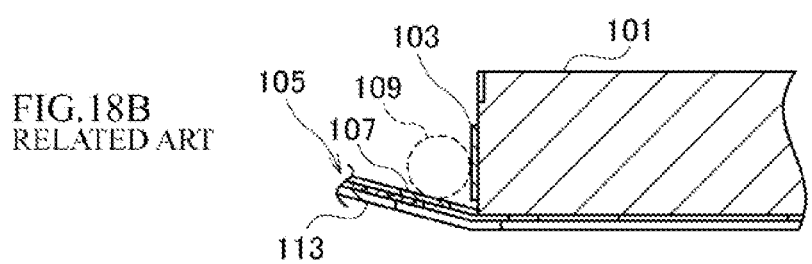

FIGS. 16A and 16B are sectional views illustrating reference holes 71E and 71 for positioning according to a comparative example and a fourth embodiment of the present invention, respectively. Components or elements of the comparative example and the fourth embodiment corresponding to those of the first embodiment are represented with the same reference numerals or the same reference numerals with "E", to eliminate duplicate explanation.

Image processing may be used for positioning of the slider with high accuracy. As a reference hole for the image processing, a conventional reference hole is formed on the conductive thin plate made of stainless steel. This structure, however, may involve positioning error between the wiring layer having the terminal and the conductive thin plate having the reference hole. In view of that, a most recent reference hole is formed on the wiring layer.

In the flexure 7E of FIG. 16A according to the comparative example, the wiring layer 35E has the reference hole 71E for image processing. For forming the reference hole 71E, the base insulating layer 33E having a thin part defined by a recess on the top surface is formed according to exposure of the polyimide precursor of photosensitive polyimide and the wiring layer 35E is formed on the top surface of the base insulating layer 33E. Before or after forming the reference hole 71E on the wiring layer 35E, the thin part of the base insulating layer 33E is removed by etching from the back or bottom. As a result, a reference-hole-forming part 73E defining the reference hole 71E drops toward the conductive thin plate 31. With this drop, unnecessary edges are generated at points P, Q and R of FIG. 16A on top and bottom surfaces of the reference-hole-forming part 73E.

These edges are detected at the time of the image processing to cause an incorrect recognition of the reference hole 71E.

In the flexure 7 of FIG. 16B according to the fourth embodiment, the wiring layer 35 has the reference hole 71 for image processing and the raising structure 41 is applied to the reference-hole-forming part 73 as the functional part defining the reference hole 71.

The method according to the fourth embodiment to provide the reference-hole-forming part 73 with the raising structure 41 conducts process steps similar to those of the first embodiment. The method, therefore, adds the raising layer (not illustrated) to the conductive thin plate 31 before forming the base insulating layer 33. Then, the method applies the polyimide precursor of photosensitive polyimide on the conductive thin plate 31 and cure the same to form the base insulating layer 33. Thereafter, the method removes the raising layer through etching of part of the conductive thin plate 31. With this, the reference-hole-forming part 73 of the raising structure 41 is formed to have the top surface flush with that of the general part 35a of the wiring layer 35.

As is apparent from the comparison between FIGS. 16A and 16B, the reference-hole-forming part 73 to which the raising structure 41 is applied prevents the incorrect recognition at the time of the image processing.

What is claimed is:

1. A wiring circuit board comprising:
    a metal support layer forming a substrate;
    an electric insulating layer laid on a surface of the metal support layer;
    a wiring layer having a general part laid on a surface of the electric insulating layer and a functional part connected to the general part to provide a given function; and
    a raising structure in a thickness direction of the wiring layer provided to the functional part independently of the metal support layer so that the functional part protrudes from a surface of the general part or has a surface being flush with the surface of the general part.

2. The wiring circuit board according to claim 1, wherein the functional part is a terminal to provide an external conductive connection.

3. The wiring circuit board according to claim 2, further comprising:
    an opening formed through the metal support layer and the electric insulating layer so that the terminal in the raising structure faces the opening to form a flying lead.

4. The wiring circuit board according to claim 1, further comprising:
    an opening formed through the metal support layer; and
    an aerial wiring part being provided to the wiring layer and passing over the opening, wherein
    the functional part is the aerial wiring part.

5. The wiring circuit board according to claim 1, further comprising:

a reference-hole-forming part provided to the wiring part to define a reference hole for image processing, wherein the functional part is the reference-hole-forming part.

6. A method of manufacturing a wiring circuit board, the wiring circuit board including a metal support layer forming a substrate, an electric insulating layer laid on a surface of the metal support layer, a wiring layer having a general part laid on a surface of the electric insulating layer and a functional part connected to the general part to provide a given function, and a raising structure in a thickness direction of the wiring layer provided to the functional part independently of the metal support layer so that the functional part protrudes from a surface of the general part or has a surface being flush with the surface of the general part, comprising:

adding a raising layer to the metal support layer for forming the raising structure before the electric insulating layer is laid on the surface of the metal support layer.

7. The method according to claim 6, wherein the functional part is a terminal to provide an external conductive connection and the adding step adds the raising layer to a position of the metal support layer on which a part of the wiring layer to be the terminal is laid.

8. The method according to claim 6, wherein the functional part is an aerial wiring part being provided to the wiring layer and passing over an opening that is formed through the metal support layer and the adding step adds the raising layer to a position of the metal support layer on which a part of the wiring layer to be the aerial wiring part is laid.

9. The method according to claim 6, wherein the functional part is a reference-hole-forming part provided to the wiring part to define a reference hole for image processing and the adding step adds the raising layer to a position of the metal support layer on which a part of the wiring layer to be the reference-hole-forming part is laid.

10. The method according to claim 6, wherein the raising layer is made of any one or any combination of insulating material, copper, nickel and chrome that are etched in a shorter time than the electric insulating layer.

* * * * *